(12) United States Patent
Tsuchiya et al.

(10) Patent No.: US 7,452,257 B2
(45) Date of Patent: Nov. 18, 2008

(54) METHOD OF MANUFACTURING A DISPLAY DEVICE

(75) Inventors: Kaoru Tsuchiya, Atsugi (JP); Ayumi Ishigaki, Atsugi (JP); Keiko Saito, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 219 days.

(21) Appl. No.: 10/736,790

(22) Filed: Dec. 17, 2003

(65) Prior Publication Data
US 2004/0246432 A1 Dec. 9, 2004

(30) Foreign Application Priority Data
Dec. 27, 2002 (JP) .................... 2002/380457

(51) Int. Cl.
*H01J 9/00* (2006.01)
(52) U.S. Cl. .............. 445/24; 445/25; 445/59; 427/58; 427/66
(58) Field of Classification Search .......... 445/24, 445/59, 25; 313/504, 506
See application file for complete search history.

(56) References Cited

U.S. PATENT DOCUMENTS

| | | | |
|---|---|---|---|
| 6,246,179 B1 * | 6/2001 | Yamada | 315/169.3 |
| 6,259,202 B1 * | 7/2001 | Sturm et al. | 313/504 |
| 6,306,559 B1 * | 10/2001 | Tanamura et al. | 430/315 |
| 6,339,290 B1 * | 1/2002 | Nakaya | 313/506 |
| 6,506,636 B2 | 1/2003 | Yamazaki et al. | |
| 6,664,732 B2 | 12/2003 | Yamazaki et al. | |
| 6,992,332 B2 | 1/2006 | Yamazaki et al. | |
| 2001/0026846 A1 | 10/2001 | Yamazaki et al. | |
| 2001/0055841 A1 * | 12/2001 | Yamazaki et al. | 438/151 |
| 2002/0038997 A1 * | 4/2002 | Sakai et al. | 313/495 |

(Continued)

FOREIGN PATENT DOCUMENTS

EP  0 989 778 A1  3/2000

(Continued)

OTHER PUBLICATIONS

Sugiyama et al.; "Dependence of indium-tin-oxide work function on surface cleaning method as studied by ultraviolet and x-ray photoemission spectroscopies"; *Journal of Applied Physics*, vol. 87, No. 1; pp. 295-298; Jan. 1, 2000.

(Continued)

*Primary Examiner*—Mariceli Santiago
(74) *Attorney, Agent, or Firm*—Fish & Richardson P.C.

(57) ABSTRACT

In order to suppress defect modes such as shrinkage or unevenness in light-emission in a light emitting element and to shorten a time needed for a pretreatment for forming a layer containing an organic compound (EL layer), according to the present invention, a light emitting element is formed by forming a first electrode that is electrically connected to a source region or a drain region of a thin film transistor, forming an insulating film to cover an edge portion of the first electrode, performing a plasma treatment on the first electrode and the insulating film in an atmosphere containing argon and oxygen, then, forming a layer containing an organic compound (EL layer) over the first electrode and the insulating film, and forming a second electrode over the layer containing an organic compound (EL layer).

29 Claims, 5 Drawing Sheets

U.S. PATENT DOCUMENTS

| | | | |
|---|---|---|---|
| 2002/0057055 A1* | 5/2002 | Yamazaki et al. | 313/506 |
| 2002/0074936 A1* | 6/2002 | Yamazaki et al. | 315/504 |
| 2002/0113248 A1 | 8/2002 | Yamagata et al. | |
| 2003/0117069 A1* | 6/2003 | Kato et al. | 313/504 |
| 2003/0162314 A1* | 8/2003 | Yamazaki et al. | 438/46 |
| 2003/0189210 A1* | 10/2003 | Yamazaki et al. | 257/72 |
| 2003/0193054 A1 | 10/2003 | Hayakawa et al. | |
| 2003/0197178 A1 | 10/2003 | Yamazaki et al. | |
| 2003/0230764 A1 | 12/2003 | Yamazaki et al. | |
| 2004/0072380 A1 | 4/2004 | Yamazaki et al. | |
| 2004/0080263 A1 | 4/2004 | Yamazaki et al. | |
| 2004/0242111 A1* | 12/2004 | Morii | 445/24 |

FOREIGN PATENT DOCUMENTS

| | | |
|---|---|---|
| JP | 7-142168 | 6/1995 |
| JP | 10-214682 | 8/1998 |
| JP | 2003-217843 | 7/2003 |
| JP | 2003-257948 | 9/2003 |
| WO | WO 99/48339 A | 9/1999 |
| WO | WO 2003/70855 A | 8/2003 |

OTHER PUBLICATIONS

PCT International Search Report, Mar. 2, 2004, 2 pages.

PCT International Preliminary Examination Report, with partial translation, Sep. 28, 2004, 7 pages.

PCT International Preliminary Examination Report (PCT/JP03/16356), with partial translation, Sep. 28, 2004, 7 pages.

Republic of China Office Action (Application No. 200380107560.7; PCTCN6872) dated Feb. 1, 2008 (15 total pages).

* cited by examiner

FIG. 2
(A)
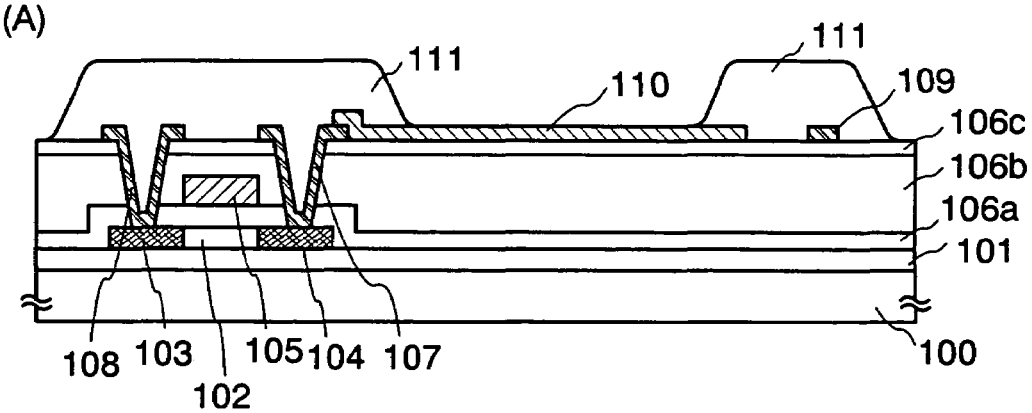
(B)
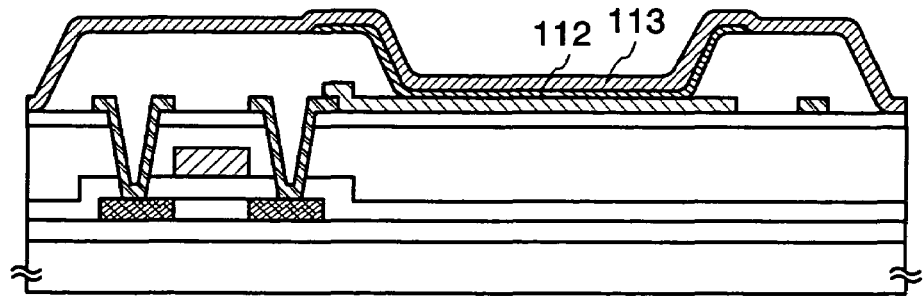

(A)

(B)

FIG. 5
(A)
 
(B)
 
(C)
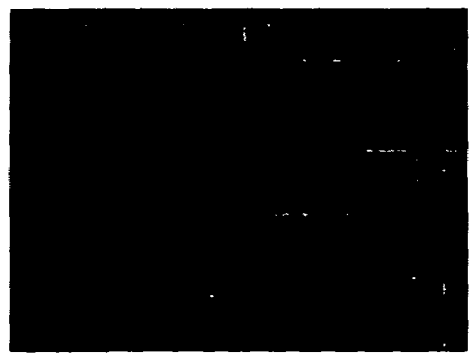 

FIG. 6
(A)
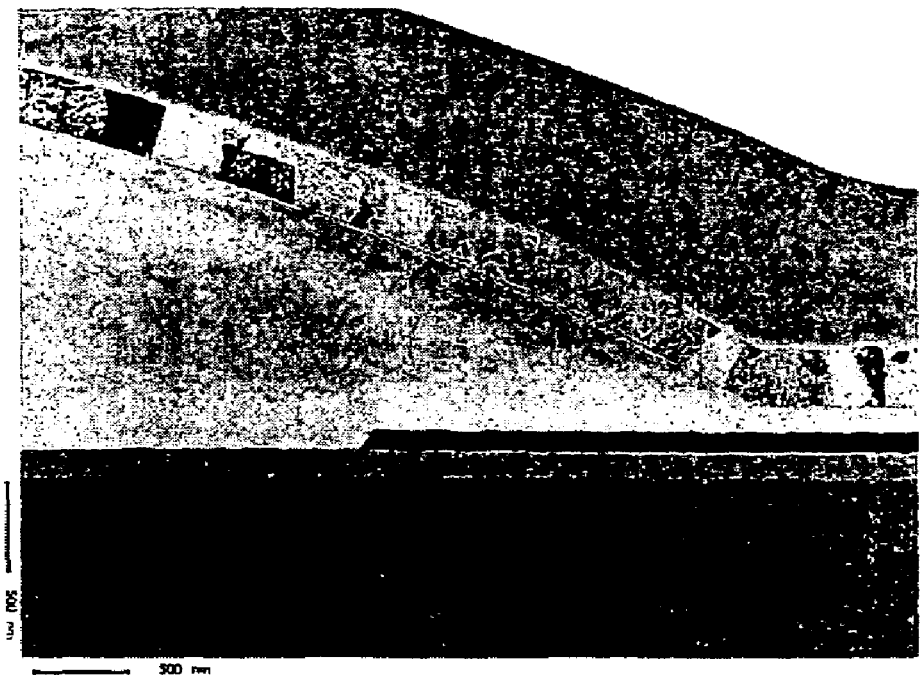
(B)
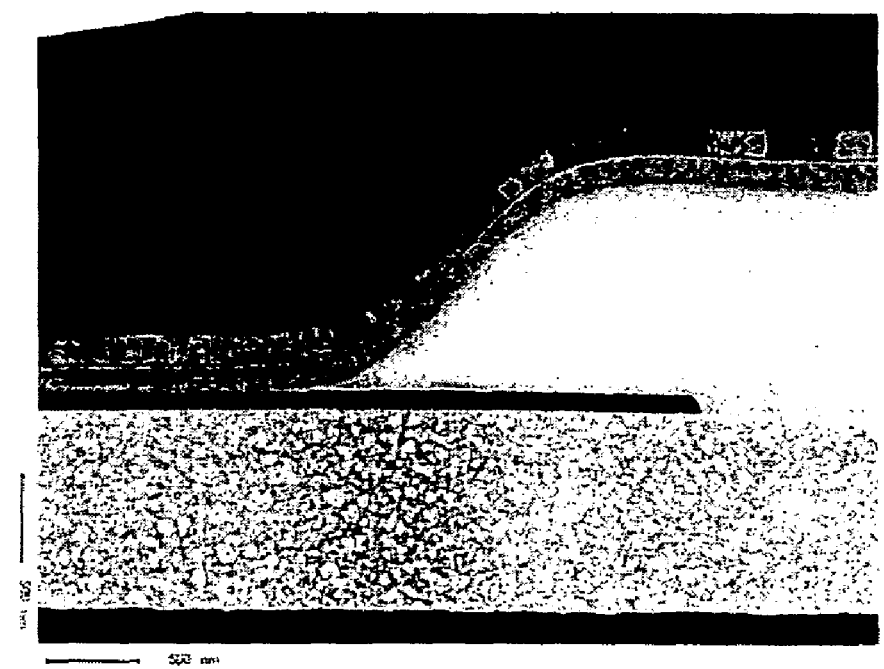

METHOD OF MANUFACTURING A DISPLAY DEVICE

TECHNICAL FIELD

The present invention relates to a display device in which electroluminescence (hereinafter, referred to as EL) element is formed over a substrate. Specifically, the present invention relates to a manufacturing method of an organic EL element.

BACKGROUND ART

In recent years, a display device having an EL element as a self-luminous type light-emitting element is under intense study. In particular, a display device using an organic material as an EL material attracts an attention. The display device is also referred to as an EL display. The display device has no limitation in viewing angle because it is a self-luminous type, which is different from a liquid crystal display device.

An EL element has a structure in which a layer containing an organic compound (EL layer) is sandwiched with a pair of electrodes. The EL layer normally has a laminated structure: a structure in which a hole injecting layer/a hole transporting layer/a light-emitting layer/an electron transporting layer are sequentially laminated over an anode, or a structure in which a hole injecting layer/a hole transporting layer/a light-emitting layer/an electron transporting layer/an electron injecting layer are sequentially laminated over an anode. Fluorescent pigments or the like may be doped into a light-emitting layer. For forming these layers, either a low molecular weight material or a high molecular weight material may be used.

In this specification, a layer containing an organic compound (EL layer) is a generic name for all layers formed between a cathode and an anode. Therefore, each of the above-mentioned hole injecting layer, hole transporting layer, light emitting layer, electron transporting layer, and electron injecting layer is included in the EL layer. It is known that a film formation method for these organic compounds is a vapor deposition method, a spin coating method, an ink-jet method or the like.

There are two methods of forming an EL element, that is, one is a method of forming an EL layer between two types of stripe shape electrodes that are formed in such a way that they can intersect with each other (simple matrix method), and the other is a method of forming an EL layer between an opposing electrode and a pixel electrode that is arranged in matrix form and connected to thin film transistors (hereinafter, TFT) (active matrix method). However, when a pixel density increases, it is considered advantageous to use the active matrix type in which a switch is provided for every pixel (or every dot) since it can be driven at low voltage.

An organic EL element deteriorates mainly due to moisture or oxygen, thereby generating partial lower luminance or non-light emitting region. As a deterioration pattern, there is a deterioration of enlarging a non-light emitting region with time and ending up wholly generating the non-light emitting region in storing of not-driving or driving. A non-light emitting region tends to generate from the periphery of a light-emitting region. A non-light emitting region is magnified and the light emitting region appears to shrink, thus this deterioration mode is referred to as "shrinkage". Note that FIG. 4(A) shows a light-emitting state immediately after an EL element is manufactured, and FIG. 4(B) shows a state in which shrinkage generates with time just after the EL element manufactured.

Particularly, in the case where the area of a minimum display unit (pixel) of a light emitting region is small like an active matrix EL element, it becomes dark in a whole pixel as soon as a shrink generates inside the pixel. Accordingly, it is difficult to obtain a display having a high precision (pixel pitch is small) and a high reliability when shrinkage generates, in the case of a display device using an organic EL element.

DISCLOSURE OF INVENTION

Problems to be Solved by the Invention

As the shrinkage processes, the following processes are given: a process in which outside moisture enters through a hole, which is formed there because a surface of an insulating film is rough and the coverage of a cathode is not favorable, and then the moisture reaches an EL layer; a process in which moisture absorbed in an organic compound such as an insulator evaporates while storing at high temperature and reaches an EL layer; and a process in which moisture adsorbed in a whole surface of a substrate gradually reaches an EL layer and causes a deterioration.

The above-described insulating film is referred to as "bank" or "dividing wall". When a display device is manufactured in matrix, insulating film is formed to cover an edge portion of an anode to keep insulation between adjacent pixels or wirings (reference numeral 30 shown in FIG. 1(B) and reference numeral 111 shown in FIG. 2(A)).

In the shrinkage processes, the moisture that has entered from outside is resolved, by reducing unevenness of the surface of the insulting film and by forming a smooth tapered-shape, preferably a shape having a curved surface with a curvature radius in an upper portion or a lower portion (the examples are shown in FIG. 6A or 6B), thereby making the coverage of the cathode favorable.

Further, moisture absorbed in an insulating film or moisture attached to a surface of a substrate can be removed by performing vacuum heating as a pretreatment. However, it takes a long time to evacuate an apparatus and to heat up to a predetermined temperature as well as to heat and cool a substrate for the sake of adequate vacuum heating to prevent shrinkage, and thus can be a rate-controlling point in mass production. Note that the term pretreatment of this specification indicates a step that is performed immediately before vapor deposition of a layer containing an organic compound (EL layer) and constantly performed under reduced pressure till the vapor deposition.

A conventional technique reports that a plasma treatment is performed by applying a high frequency voltage in an argon atmosphere as a pretreatment for a substrate and thus, an organic compound on the substrate is removed and unevenness in light emitting is prevented, and further generation of shrinkage is suppressed Japanese Patent Laid Open No. H7-142168). However, there is another report that the work function of ITO decreases when a plasma treatment is performed by applying a high frequency voltage in an argon atmosphere (Kiyoshi Sugiyama, Hisao Ishii and Yukio Ouchi: J. Appl. Phys. 87.1.295-298 (2000)). Further, an insulating film made of an organic compound such as acrylic that is formed in an edge portion of an anode is cut off when a plasma treatment is performed in an oxygen atmosphere. The insulating film is cut off excessively and thus the cathode and the anode short out.

The present invention has been made for the purpose of solving the problems in order to perform a plasma treatment for suppressing the generation of defect mode such as shrinkage in an organic EL element, and further for the purpose of saving a time that is needed for a pretreatment.

Means for Solving the Problem

The present inventors have discovered that a time needed for a pretreatment for a substrate can be shortened, shrinkage or unevenness of light-emission can be suppressed, and an insulating film is not cut off excessively, by generating plasma by applying high frequency voltage in an atmosphere containing argon and oxygen, and making the generated plasma collide with a first electrode and the insulating film to knock out moisture and dusts for cleaning, before forming a layer containing an organic compound (EL layer). It is also found that the work function of an ITO film as an anode is not reduced in the case of using the ITO as the first electrode.

According to the present invention, a method for manufacturing a display device comprising a thin film transistor and a light emitting element, wherein the light emitting element includes a first electrode electrically connected to a source region or a drain region of the thin film transistor, a layer containing an organic compound (EL layer) formed over the first electrode, a second electrode formed over the layer containing an organic compound (EL layer), comprising the steps of: forming the first electrode electrically connected to the source region or the drain region, forming the insulating film to cover an edge portion of the first electrode, performing a plasma treatment on the first electrode and the insulating film in an atmosphere containing argon and oxygen, thereafter, forming the layer containing an organic compound (EL layer) over the first electrode and the insulating film, forming the second electrode over the layer containing an organic compound (EL layer), and forming the light emitting element by the steps. Here, the layer containing an organic compound (EL layer) includes a hole injecting layer, a hole transporting layer, a light-emitting layer, an electron transporting layer and an electron injecting layer.

The flow rate of an argon gas and an oxygen gas for the plasma treatment that is conducted in an atmosphere containing argon and oxygen is within the range from 1 to 9 through 9 to 1. When the insulating film is made of an organic material such as acrylic, vacuum heating may be performed so as to completely remove moisture adsorbed there just before performing the plasma treatment that is conducted in an atmosphere containing argon and oxygen.

The temperature of the vacuum heating is from 100° C. to 250° C., and the degree of vacuum is $1 \times 10^{-3}$ Pa or less, preferably, $1 \times 10^{-4}$ Pa or less. Further, it is preferable to combine another cleaning method such as wet-cleaning or UV/ozone cleaning, in addition to the vacuum heating, since the degree of cleaning before performing the plasma treatment that is conducted in an atmosphere containing argon and oxygen can be kept constant.

In the above configuration, the step of vacuum heating, the step of performing the plasma treatment in the atmosphere containing argon and oxygen, the step of forming a layer containing an organic compound (EL layer), and the step of forming the second electrode are preferably performed sequentially and continuously in vacuum or in the atmosphere containing argon and oxygen without being exposed to the air. Further, it is desirable that a step of sealing is also performed continuously without being exposed to the air, thereby suppressing intrusion of moisture or oxygen and enhancing reliability. Moreover, in the above configuration, the step of forming the second electrode is performed by resistance heating or sputtering and thus, the damage to a TFT is little.

EFFECT OF THE INVENTION

According to the present invention, a plasma treatment in an atmosphere containing argon and oxygen can be employed as a pretreatment for suppressing a shrinkage or generation of unevenness in light-emission without adversely effecting on a substrate. Therefore, the pretreatment can be performed in a short time.

BRIEF DESCRIPTION OF DRAWINGS

FIG. 2 shows steps of Embodiment 1.
FIG. 5 shows shrinkages for comparing the present invention with a conventional one.
FIG. 6 is a TEM photograph showing Embodiment Mode.

BEST MODE FOR CARRYING OUT THE INVENTION

Figure 1:
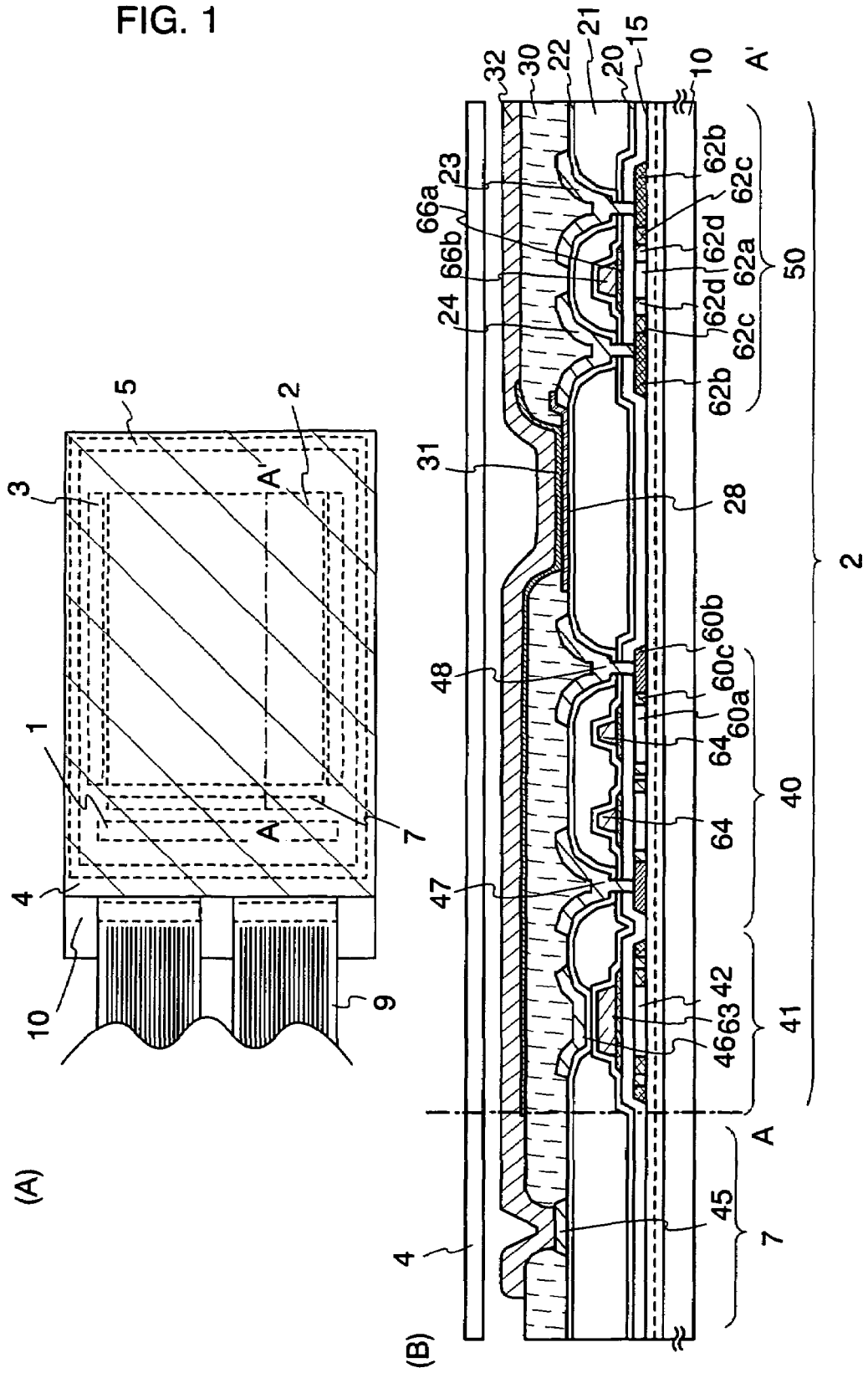
FIG. 1 is a top view and a cross sectional view showing Embodiment Mode.

Hereinafter, Embodiment Mode of the present invention is described with reference to FIG. 1.

Embodiment Mode

FIG. 1(A) is a top view of an active matrix type display device, and FIG. 1(B) is a cross sectional view taken along a chained line A-A'.

In FIG. 1(A), reference numeral 1 denotes a source signal line driver circuit, reference numeral 2 denotes a pixel portion, and reference numeral 3 denotes a gate signal line driver circuit. Moreover, reference numeral 4 denotes a sealing substrate, reference numeral 5 denotes a sealing agent, and the inside surrounded by the sealing agent 5 is a space filled with an inert gas which is dried with a desiccating agent (not shown). Reference numeral 7 denotes a connecting region for connecting an upper portion electrode that is common for each light emitting element to wirings on a substrate.

It should be noted that a video signal and a clock signal are received from a FPC (Flexible Print Circuit) 9 which is to be an external input terminal. Note that although herein only the FPC is shown, a printed wiring board (PWB) may be mounted on the FPC. A display device in this specification includes not only the display device itself but also a device in which an FPC or PWB is mounted thereon.

A CMOS circuit in which an n-channel TFT and a p-channel TFT are combined is formed as the source signal line driver circuit 1. An n-channel TFT has a channel forming region which is overlapped with the upper and lower layers of a gate electrode with a gate insulating film 15 sandwiched therebetween, a low concentration impurity region which is overlapped with the lower layer of the gate electrode with the gate insulating film 15 sandwiched therebetween, a low concentration impurity region which is not overlapped with the lower layer of the gate electrode, and a high concentration impurity region which is to be a source region or a drain region.

Moreover, a p-channel TFT has a channel forming region which is overlapped with an upper layer of a gate electrode with the gate insulating film 15 therebetween, a low concentration impurity region 62*d* which is overlapped with a lower layer of the gate electrode with the gate insulating film 15 therebetween, a low concentration impurity region which is not overlapped with the lower layer of the gate electrode, and a high concentration impurity region which is to be a source region or a drain region. Moreover, a driver circuit may be made of a known CMOS circuit, a PMOS circuit or an NMOS circuit. Moreover, although in this specification, a driver-integrated type in which a driver circuit is formed on the substrate is shown, it is not necessary to employ such a type, but it can be formed not on the substrate but externally.

In FIG. 1(B), a cross sectional view of a current controlling TFT 50, a switching TFT 40 and a capacitor 41 is shown. In FIG. 1(B), an example using an n-channel TFT having a plurality of channel forming regions 60a which are overlapped with a gate electrode 64 with the gate insulating film 15 sandwiched therebetween is shown as the switching TFT 40. It should be noted that reference numerals 47, 48 denote a source wiring or a drain wiring, reference numeral 60b denotes a source region or a drain region, reference numeral 60c denotes a low concentration impurity region which is not overlapped with the gate electrode 64. In the capacitor 41, a storage capacitor is formed with an electrode 46 and an electrode 63 by making the interlayer insulting films 22, 20 as a dielectric material, and further also a storage capacitor is formed with the electrode 63 and a semiconductor film 42 by making the gate insulating film 15 as a dielectric material.

Moreover, the pixel portion 2 is formed from a plurality of pixels including the switching TFT 40, the current controlling TFT 50 that is connected with a first electrode (anode) 28, the first electrode (anode) 28 which is to be a lower portion electrode that is electrically connected to a drain region or source region (high concentration impurity region) 62b of the TFT, and the capacitor 41. A plurality of TFTs is formed in one pixel. The current controlling TFT 50 has a channel forming region 62a which is overlapped with an upper layer 66b and an lower layer 66a of the gate electrode with the gate insulating film 15 sandwiched therebetween, a low concentration impurity region 62d which is overlapped with the lower layer 66a of the gate electrode with the gate insulating film 15 sandwiched therebetween, and a low concentration impurity region 62c which is not overlapped with the lower layer 66a of the gate electrode. It should be noted that the reference numerals 23, 24 denote a source electrode or a drain electrode, and reference numeral 24 denotes a connecting electrode that connects the first electrode (anode) 28 to the high concentration impurity region 62b.

Moreover, as interlayer insulating films 20, 21 and 22, a photosensitive or non-photosensitive organic material (polyimide, acryl, polyamide, polyimide-amide, resist or benzocyclobutene), an inorganic material (such as silicon oxide, silicon nitride, silicon oxynitride) formed by a sputtering method, a CVD method or an application method, a laminated layer of these layers and the like can be used. In FIG. 1B, an inorganic insulating film 20 made of a silicon nitride film is provided to cover the gate electrode and the gate insulating film 15, and the inorganic insulating film 20 is an inorganic insulating film which is formed under the conditions of containing hydrogen in the film and which is provided for the purpose of the hydrogenation for terminating the dangling bond of the semiconductor layer by a heat treatment. It can hydrogenate the semiconductor layer existing in the lower location regardless of the existence of the gate insulating film 15 made of a silicon oxide film. Additionally, the interlayer insulating film 21 is selectively etched so that the upper edge portion thereof becomes a curved surface having a curvature radius by wet etching or dry etching after forming the film made of a photosensitive organic material by an application method. Moreover, in the case where an organic material is used for the interlayer insulating film 21, it is preferable that it is covered with an interlayer insulating film 22 made of a silicon nitride film, a silicon oxynitride film, an aluminum oxynitride film or a laminated layer of these films in order to block moisture, gases or impurities not so as to deteriorate a light emitting element to be formed later due to diffusion of them from the interlayer insulating film 21.

Moreover, the interlayer insulating film 22 can also block diffusion of the impurities from the substrate 10 to the light-emitting element and diffusion of the impurities from the light emitting element to the TFTs and the like. Moreover, in the case where an organic material having the hygroscopic property is used as the interlayer insulating film 21, it is necessary to bake again since it is swollen when it is exposed to the solution such as a peeling solution used in another patterning step to be performed later, however, the interlayer insulating film 21 can not be swollen by being covered with the interlayer insulating film 22.

Moreover, in the case where inorganic insulating films are used for the interlayer insulating films 20 to 22, the film formation may be carried out by a PCVD method or a sputtering method. Particularly, a silicon nitride film formed only by nitrogen gas or the mixture gas of nitrogen gas and argon gas with silicon as a target by a RF sputtering method, by setting the substrate temperature from a room temperature to 350° C., the film-formation pressure from 0.1 Pa to 1.5 Pa and by applying a high frequency power (5-20 W/cm$^2$) of 13.56 MHz, has extremely a strong blocking effect to an element belonging to I group or II group of the periodic table such as Na, or Li and can effectively suppress the diffusion of these movable ions and the like.

For a second electrode (cathode) 32 used in the present invention, a metal film in which from 0.2 wt % to 1.5 wt % (preferably, from 0.5 wt % to 1.0 wt %) of lithium is added to aluminum is preferable from the viewpoints of electric charge injection characteristic and others. However, there is fear that the operation of a transistor is damaged by the diffusion of lithium in the case of using a material containing lithium as the second electrode (cathode) 32. When the interlayer insulating film 22 is, however, a silicon nitride film formed by a RF sputtering method, it can prevent lithium from diffusing into the TFT.

When a photosensitive organic resin material is used for the interlayer insulating film 21, a contact hole tends to have a curved surface with a curvature radius at the upper edge portion thereof as shown in FIG. 1B, however, when a non-photosensitive organic resin material or an inorganic material is used for the interlayer insulating film 21, a contact hole has a shape as shown in the cross-sectional views in FIGS. 2A and 2B.

Moreover, an insulating film (which is also referred to as bank, dividing wall, embankment, mound or the like) 30 is provided for the both ends of the first electrode (anode) 28 and a layer containing an organic compound 31 (also called EL layer) is formed over the first electrode (anode) 28. A transparent conductive film (ITO (Indium oxide-Tin oxide alloy), Indium oxide-Zinc oxide alloy (In$_2$O$_3$—ZnO), Zinc oxide (ZnO) and the like) may be employed for the first electrode (anode) 28.

Since the layer containing an organic compound (EL layer) 31 is extremely thin, the surface of the first electrode (anode) 28 is preferably flat, for example, the flattening step may be carried out by a treatment for polishing it chemically and mechanically (representatively, CMP technology) and the like, before or after patterning the first electrode (anode) 28. In the case where the CMP (Chemical Mechanical Polishing) is performed, when the film thickness of an electrode 24 or the insulating film 30 is reduced, or the edge portion of electrode 24 is tapered, the degree of flatness of the first electrode (anode) 28 can be further enhanced. Moreover, in the case where an organic resin film is used for the interlayer insulating film 21 in order to enhance the degree of the flatness of the first electrode (anode) 28, it is preferable that the occurrence of cracks is prevented by providing an inorganic insulating film as the interlayer insulating film 22, and the occurrence of the non-light emitting region and the occurrence of point defects generated immediately after the formation are suppressed.

Moreover, a photosensitive or non-photosensitive organic material (polyimide, acryl, polyamide, polyimide-amide, resist or benzocyclobutene), an inorganic material (such as silicon oxide, silicon nitride, silicon oxynitride) formed by a CVD method, a sputtering method or an application method, or a laminated layer of these films and the like can be employed for the insulating film 30. Moreover, when a photosensitive organic material is used for the insulating film 30, photosensitive organic materials are largely classified into two types, that is, a negative type photosensitive organic material which is insoluble in etchant due to the light, or a positive type photosensitive organic material which is soluble in etchant by light, and, either can be appropriately used. Moreover, in the case of the insulating film 30 made of an organic material, the insulating film 30 may be covered with an inorganic insulating film (such as a silicon nitride film formed by a sputtering method).

Moreover, in order to enhance the degree of cleaning of the surface of the first electrode (anode) 28, the occurrence of dark spots or point defects is reduced by performing washing (brush washing or sponge washing) for the purpose of cleaning foreign matters (dusts and the like) before or after forming the insulating film 30. The moisture of the substrate is removed by a heat treatment using an oven at temperatures from 100° C. to 250° C. for 30 minutes to two hours at atmospheric pressure, after wet-cleaning such as sponge cleaning is performed. After cooling, a UV/ozone treatment is performed.

Subsequently, the substrate is transferred into a film formation apparatus and is applied with high-frequency voltage in an atmosphere containing argon and oxygen to generate plasma. The generated plasma is allowed to collide with the first electrode (anode) 28, the insulating film 30 and the like. There is an effect that moisture or dusts in the first electrode (anode) 28, the insulating film 30 and the like are beaten out by the plasma treatment performed in the atmosphere containing argon and oxygen, and thus, generation of shrinkage and unevenness in light-emission can be suppressed. Further, the pretreatment step can be performed in a shorter time than a conventional method. In addition, vacuum heating may be performed to completely remove moisture included in TFTs and the insulating film, before the plasma treatment performed in the atmosphere containing argon and oxygen. In the case, just after heating with an oven after cleaning, a vacuum evacuation is performed to $5 \times 10^{-3}$ Torr (0.665 Pa) or less, preferably $10^{-4}$ Pa or less, and then, a heat treatment is performed, for example, for 20 minutes or more, at temperatures from 100° C. to 250° C., preferably from 150° C. to 200° C., and then, natural cooling is performed for 20 minutes to remove the adsorbed moisture. Note that condition of the vacuum heating is appropriately required to be determined depending on materials for an interlayer insulating film or wiring, since some materials cannot resist a heat treatment of 250° C.

Subsequently, vapor deposition is performed in a vapor deposition chamber that has been vacuum evacuated to $5 \times 10^{-3}$ Torr (0.665 Pa) or less, preferably $10^{-4}$ Pa or less, thereby forming the layer containing an organic compound (EL layer) 31. The second electrode (cathode) 32 is formed over the layer containing an organic compound (EL layer) 31 by vapor deposition method (resistance heating method) or sputtering method. Thus, a light emitting element having the first electrode (anode) 28, the layer containing an organic compound (EL layer) 31 and the second electrode (cathode) 32 is formed.

A high molecular weight material, a low molecular weight material, an inorganic material, and a layer mixing these materials or a layer that is dispersed with them, or a laminated layer in which these layers are appropriately combined may be used as the layer containing an organic compound (EL layer) 31. Note that a vacuum heating is preferably performed to deaerate after forming the layer containing an organic compound (EL layer) 31.

A light emitting display device may function as a full color display with white light emission from a layer containing an organic compound (EL layer) 31 through a color filter or a color conversion layer and like that are provided separately. In the case of using the device as a display device or a lighting device performing only a simple display, it may employ monochromatic light emission (typically, white color light emission). For example, 1,3,4-oxadiazole derivative (PBD) having an electron transporting characteristic may be dispersed into polyvinyl carbazole (PVK) having a hole transporting characteristic. Moreover, white color light emission can be obtained by dispersing 30 wt % of PBD as an electron transporting agent and by dispersing a suitable amount of four kinds of pigments (tetraphenylbutadiene (TPB), coumarin 6,4-dicyanomethylene-2-methyl-6-p-dimethylaminostyryl-4H-pyran (DCM1), and Nile red). Alternatively, white color light emission can be obtained as a whole by appropriately selecting organic compound films for red light, green light, and blue light, and then, by laminating them and mixing the colors.

It should be noted that since the second electrode (cathode) 32 gives the damage to a TFT by X-ray which is radiated at the time when it is vapor deposited by a vapor deposition method using an electron beam, it is preferably vapor deposited by a resistance heating method. As the material for the second electrode (cathode) 32, an alloy such as MgAg, MgIn, AlLi, $CaF_2$, or CaN, or a film formed by co-evaporation of an element belonging to I group or II group of the periodic table and aluminum may be employed in a film thickness ranging from 100 nm to 500 nm. The second electrode (cathode) 32 made of a thicker film can better block the diffusion of moisture or oxygen into the layer containing an organic compound (EL layer).

In the case of a light emitting element for white color, a color filter including a colored layer and a black matrix (not shown for simplification) is provided for the substrate 10.

The second electrode (cathode) 32 also functions as a wiring common for all pixels, and is electrically connected to the FPC 9 via a wiring. It should be noted that in FIGS. 1(A) and 1(B), the connecting region 7 which connects the second electrode (cathode) 32 to a wiring 45 is shown, and the second electrode (cathode) 32 is electrically connected to the FPC 9 by leading the wiring 45.

Moreover, in a terminal portion, a terminal electrode formed by laminating an electrode formed in the same step as the gate electrode, an electrode in the same step as the source electrode or drain electrode and an electrode formed in the same step as the first electrode (anode) 28, is attached to the FPC 9 by an adhesive material such as a conductive adhesive material. By the way, the structure of the terminal portion is not particularly limited and can be appropriately formed.

Moreover, the sealing substrate 4 is attached by a sealing agent 5 containing a filler in order to seal the light-emitting element formed over the substrate 10. It should be noted that a spacer made of a resin film may be provided in order to retain the interval between the sealing substrate 4 and the light emitting element. Then, an inert gas such as nitrogen is filled in the interior space of the sealing agent 5. Epoxy resin is preferably used as the sealing agent 5. Moreover, the sealing agent 5 is preferably made of a material which does not transmit moisture or oxygen. Furthermore, a substance having an effect of absorbing oxygen or moisture (desiccating agent or the like) may be provided within the space.

Moreover, in the present invention, a plastic substrate made of FRP (Fiberglass-Reinforced Plastics), PVF (poly vinyl fluoride), Mylar, polyester, acryl or the like can be employed as the material for the sealing substrate 4 as well as a glass substrate, a quartz substrate and the like. Moreover, after the sealing substrate 4 is adhered by the sealing agent 5, it is also possible to seal with a sealing agent to cover the side face (exposed face).

As described above, the light emitting element can be completely blocked from outside by sealing the light emitting element in the closed space, which can prevent a substance such as moisture or oxygen promoting deterioration of an organic compound layer from invading into it. Therefore, a light-emitting device having high reliability, in which shrinkage has not occurred, can be obtained.

Moreover, in the present invention, the structure of the switching TFT 40 of the pixel portion of FIG. 1(B) is not limited to the above described structure, for example, in addition to the low concentration impurity region 60c which is not overlapped with the gate electrode with the gate insulating film therebetween, a low concentration impurity region 60b overlapping with the gate electrode may be provided between the channel forming region 60a and the drain region (or source region). Moreover, the shape of the gate electrode is not limited, either, and a single layer of gate electrode may be used.

In addition, although herein a top gate type TFT has been exemplified, the present invention can be applied, regardless of the TFT structure, for example, the present invention can be applied to a bottom gate type (reverse stagger type) TFT.

Moreover, in FIG. 1(B), a structure in which the first electrode (anode) 28 is formed after forming the connecting electrode 24 being in contact with a source region or a drain region is shown, however, it is not particularly limited, for example, a connecting electrode being in contact with the source region or drain region may be formed after forming the first electrode (anode) 28.

Moreover, an interlayer insulating film for covering an electrode which is in contact with the source region or drain region is further provided, and then, a contact hole is formed, a first electrode (anode) for connecting to the electrode on the interlayer insulating film may be formed.

Embodiment

Now, an example is shown below, in which a first electrode connected to a TFT is an anode, a layer containing an organic compound (EL layer) and a second electrode (cathode) are formed over an active matrix substrate where the first electrode is arranged in matrix form (FIG. 2).

First, a TFT is formed over a substrate 100 having an insulating surface. The TFT includes a gate electrode 105, a gate insulating film 106a, a channel forming region 102, a source region or a drain region 103, 104, a source electrode or a drain electrode 107, 108, and insulating films 106b, 106c. For the first electrode (anode) 110, usually, a metal whose work function is large (such as Pt, Cr, W, Ni, Zn, Sn and In) is used, and in this embodiment, a conductive film made of an ITO formed by sputtering is employed. In this embodiment, a p-channel TFT, which is made of a semiconductor film (representatively, a polysilicon film) in which a channel forming region has a crystal structure, is used as the TFT.

It should be noted that the top layer of an interlayer insulating film of the TFT, that is, an insulating layer 106c in contact with the first electrode (anode) 110 on its bottom surface, is an inorganic insulating film (representatively, a silicon nitride film formed by RF sputtering). By providing an inorganic insulating film which is excellent in coverage, cracks of the first electrode (anode) 110 to be formed thereover can be eliminated. Moreover, since the amount of moisture adsorbed on the surface can be reduced by using an inorganic insulating film, the occurrence of shrinkage can be suppressed, even if the film formation of a layer containing an organic compound (EL layer) is performed later.

The silicon nitride film formed by RF sputtering is a dense film formed by using silicon as a target, whose etching rate in using LAL500 is as slow as 0.77 nm/min to 8.6 nm/min, and the hydrogen concentration in the film is measured as $1 \times 10^{21}$ atoms/cm$^3$ by SIMS measurement. It should be noted that LAL500 is "LAL500 SA buffered hydrogen fluoride" made by Hashimoto Kasei, Co., Ltd., which is an aqueous solution including $NH_4HF_2$ (7.13%) and $NH_4F$ (15.4%). Moreover, as for the silicon nitride film formed by RF sputtering, since there is almost no shifts of C-V characteristics after BT stress test, the blocking of alkali metal and impurities is possible.

Moreover, utilizing an organic resin film as the interlayer insulating film 106b can enhance the flatness. Moreover, in the case where a silicon oxide film, a silicon oxynitride film or a silicon nitride film formed by PCVD method or sputtering method is used instead of the organic resin film, the occurrence and expansion of a non-light emitting region immediately after forming the light emitting element do not generate, and cracks of the first electrode (anode) 110 can be also eliminated.

Subsequently, an insulating film 111 for covering an edge portion of the first electrode (anode) 110 is formed (FIG. 2A). The insulating film 111 is formed in order to keep the insulation between the adjacent pixels or from the wirings by covering a contact hole of a TFT or the wiring 109. An inorganic material (such as silicon oxide, silicon nitride, silicon oxynitride), a photosensitive or non-photosensitive organic material (such as polyimide, acryl, polyamide, polyimide-amide, resist or benzocyclobutene), or a laminated layer of these and the like can be used as the insulating film 111. A negative type photosensitive acryl which is insoluble in etchant by light is used, and thus a curved surface having the first curvature radius is made at the upper edge portion of the insulating film 111 and a curved surface having the second curvature radius is made at the lower edge portion thereof. The above described first and second curvature radii are preferably from 0.2 μm to 3 μm.

Positive-type organic resin which is soluble in etchant by light is used in this embodiment. In this case, the curved surface having a curvature radius can be made only at the upper edge portion of the insulating film 111. The non-light emitting region immediately after forming the light-emitting element is not to be generated by forming the curved surface having a curvature radius at the upper edge portion or at the lower edge portion of the insulating film 111. The insulating film 111 may have either shape.

Moreover, the insulating film 111 may be covered with a protective film made of an aluminum nitride film, an aluminum nitride oxide film, or a silicon nitride film. Since water adsorbed on the surface can be reduced by covering it with a protective film made of an inorganic insulating film, when a layer containing an organic compound (EL layer) is formed later, the occurrence of shrinkage can be suppressed.

Figure 3:
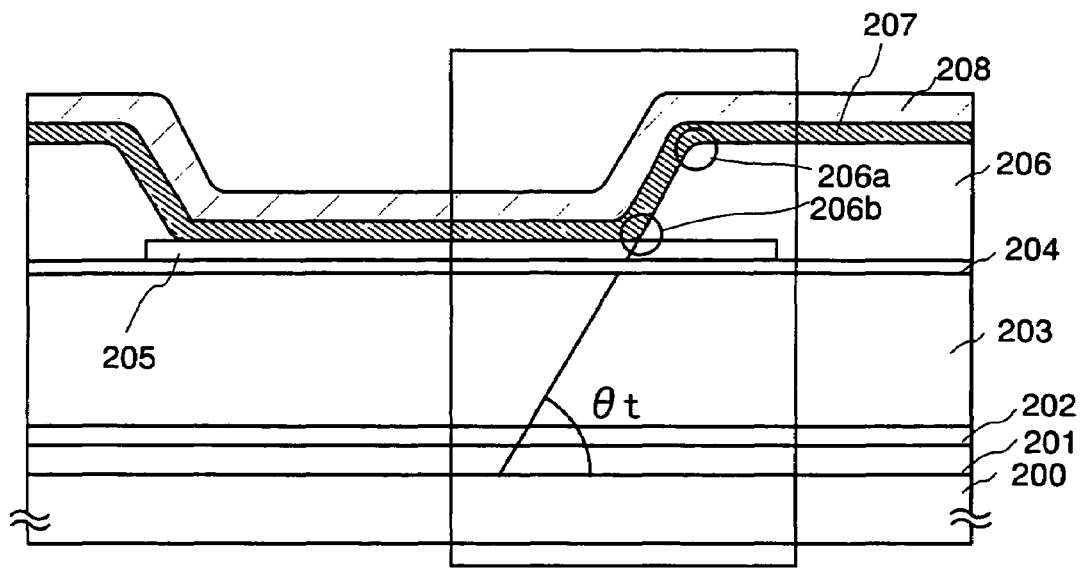
FIG. 3 shows Embodiment 1.
Figure 4:
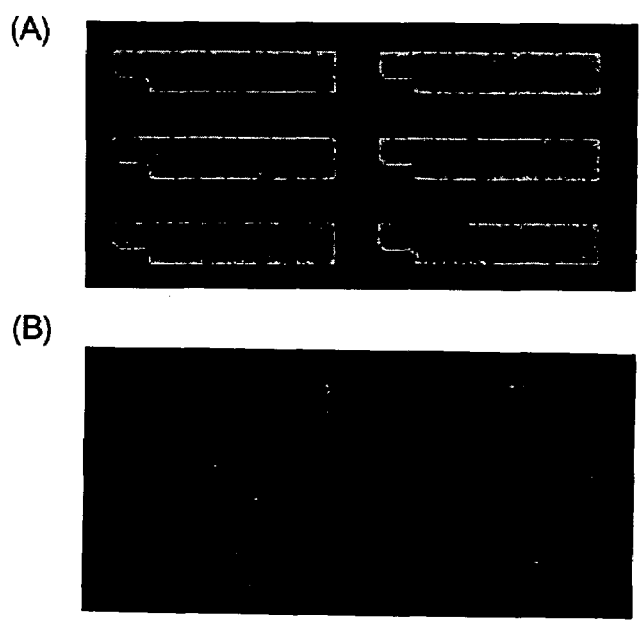
FIG. 4 shows shrinkages that expand with time.

Effects obtained by forming the curved surface having a curvature radius at the upper edge portion or at the lower edge portion of the insulating film are described with reference to FIG. 3. In FIG. 3, reference numeral 200 denotes a substrate, reference numeral 201 denotes a base insulating film, reference numeral 202 denotes a gate insulating film, reference numeral 203 denotes an interlayer insulating film, reference numeral 204 denotes a silicon nitride film, reference numeral 205 denotes a first electrode (anode), reference numeral 206 denotes an insulating film, reference numeral 207 denotes a layer containing an organic compound (EL layer), and reference numeral 208 denotes a second electrode (cathode). The insulating film 206 has a curved surface at the upper edge portion 206a (the region surrounded by the circle in FIG. 3, and also has a curved surface at the lower edge portion 206b (the region surrounded by the circle in FIG. 3). The insulating film 206 has an angle (taper angle) θt (θt=from 35° to 70°) between the surface of the substrate and the side face of the insulating film 206, and it is gently sloping. And the insulating film 206 has an effect that the coverage of the layer containing an organic compound (EL layer) 207 and the second electrode (cathode) 208 which are formed thereover is excellent.

After forming the insulating film 111, in order to remove the minute grains dotted on the surface of the first electrode (anode) 110, the surface of the first electrode (anode) 110 is rubbed and washed using a porous sponge (representatively, made of PVA (polyvinyl alcohol) or nylon) containing a surfactant (weak alkali). After that, an hour's heating is performed in an oven of 200° C. at atmospheric pressure. After natural cooling, a UV/ozone treatment is performed for 370 seconds and a substrate is set in a film formation apparatus to perform a plasma treatment in the atmosphere containing argon and oxygen. In this embodiment, after the pressure of the chamber in the film formation apparatus is reduced to a vacuum degree of $1 \times 10^{-5}$ Torr, gases are introduced by the flow rate ratio of Ar:$O_2$=67 sccm: 133 sccm (3:7), until the pressure becomes $8.3 \times 10^{-2}$ Torr (11 Pa), and high frequency voltage is applied with 75 W and Gap 50 mm for 90 seconds to perform a plasma treatment in the atmosphere containing argon and oxygen.

As for the layer containing an organic compound (EL layer) 112, in the case of a full color display, concretely, material layers showing the light emissions of red color, green color and blue color may be selectively formed, respectively, by vapor deposition using a vapor deposition mask or by ink jetting appropriately.

In this embodiment, the layer containing an organic compound (EL layer) 112 that emits green light is formed. CuPc of 20 nm thick as a hole injecting layer, 4,4-bis[N-(naphthyl)-N-phenyl-amino]-biphenyl (hereinafter, referred to as α-NPD) of 40 nm thick that is an aromatic amine group material as a hole transporting layer are each formed, and then, tris-6-quinolinolato aluminum complex doped with dimethyl quinacridone (DMQD) (hereinafter, referred to as Alq$_3$) of 40 nm thick as a light-emitting layer for green light, Alq$_3$ of 40 nm thick as an electron transporting layer, and CaF$_2$ of 1 nm thick as an electron injecting layer are each formed by using the same vapor deposition mask.

Further, when the layer containing an organic compound (EL layer) 112 that emits blue light is formed, CuPc of 20 nm thick as a hole injecting layer, A-NPD of 40 nm thick as a hole transporting layer and a light-emitting layer are each formed. Then, bathocuproin (BCP) of 10 nm thick as a blocking layer, Alq$_3$ of 40 nm thick as an electron transporting layer, and CaF$_2$ of 1 nm thick as an electron injecting layer are each formed by using the same mask.

Moreover, when a layer containing an organic compound (EL layer) 112 that emits red light is formed, CuPc of 20 nm thick as a hole injecting layer, α-NPD of 40 nm thick as a hole transporting layer are each formed. Then, Alq$_3$ doped with DMQ1 of 40 nm thick as a light-emitting layer for red light, Alq$_3$ of 40 nm thick as an electron transporting layer, and CaF$_2$ of 1 nm thick as an electron injecting layer are each formed by using the same mask.

It should be noted that since the second electrode (cathode) 113 gives the damage to a TFT by X-ray which is radiated at the time when it is vapor deposited by vapor deposition using an electron beam, the second electrode (cathode) 113 is preferably vapor deposited by resistance heating. As the material for the second electrode (cathode) 113, an alloy such as MgAg, MgIn, AlLi, CaF$_2$, or CaN, or a film formed by a co-evaporation of an element belonging to I group or II group of the periodic table and aluminum may be employed in a film thickness ranging from 100 nm to 500 nm. The second electrode (cathode) made of a thicker film can better block the diffusion of moisture or oxygen into a layer containing an organic compound (EL layer). In this embodiment, aluminum of 200 nm thick is formed alone by resistance heating (FIG. 2(B)).

By the above described steps from the plasma treatment in the atmosphere containing argon and oxygen to the sealing step in vacuum, a light-emitting device without shrinkage and unevenness in light-emission can be formed in a short time, and further, an organic EL element can be formed by using this.

Hereinafter, the embodiment and ones in which the condition for a pretreatment step before forming a layer containing an organic compound (EL layer) is changed were compared, as for shrinkage and unevenness in light-emission.

Comparative Example 1

The pressure of a chamber in a film formation apparatus is reduced to $1 \times 10^{-3}$ Pa or less and then, a heat treatment of 170° C. for 30 minutes and then, natural cooling for 30 minutes are performed as the pretreatment step. Without breaking the vacuum from the vacuum heating to the sealing step, an organic EL element was formed as in Embodiment.

Comparative Example 2

After UV/ozone cleaning, a vacuum heating or a plasma treatment in the atmosphere containing argon and oxygen is not performed as the pretreatment step, and an organic EL element was formed without breaking the vacuum from the vapor deposition to the sealing step as in Embodiment.

As for the organic EL elements formed in the pretreatment steps in Embodiment 1, the comparative examples 1 and 2, states of light-emission in the initial state and generation of shrinkage after preserving them for 190 hours in the atmosphere where the temperature is 65° C. and the humidity is 95% were observed.

Results of evaluation are shown in TABLE 1 and FIG. 5. In the Table, O is favorable and X is bad.

In addition, FIG. 5(A) shows results of Embodiment and the left photograph shows the light-emitting state in the initial state and the right photograph shows a state after preserving it for 190 hours in the atmosphere where the temperature is 65° C. and the humidity is 95%. Similarly, FIG. 5(B) shows results of the comparative example 1 and the left photograph shows the light-emitting state in the initial state and the right photograph shows a state after preserving it for 190 hours in the atmosphere where the temperature is 65° C. and the humidity is 95%. FIG. 5(C) shows results of the comparative example 2 and the left photograph shows the light-emitting state in the initial state and the right photograph shows a state after preserving it for 190 hours in the atmosphere where the temperature is 65° C. and the humidity is 95%.

TABLE 1

|  | Pretreatment (time) | Shrinkage after high-temperature and high-humidity preservation | Unevenness in light-emission |
|---|---|---|---|
| Embodiment | Plasma treatment in the atmosphere containing argon and oxygen (for 90 sec) | ◯ | ◯ |
| Comparative example 1 | Reduced pressure 170 oC, for 30 min and natural cooling (for 30 min) | ◯ | X |
| Comparative example 2 | Not done | X | X |

From these results, it is shown that the element that is exposed to only the plasma treatment performed in the atmosphere containing argon and oxygen in a short time as the pretreatment can suppress generation of shrinkage after the high-temperature and high-humidity preservation, to the same level as the element that is exposed to a vacuum heating for a longtime. Further, an organic EL element without unevenness in light-emission can be obtained, since organic materials that have not been removed only by vacuum heating and have been left over the first electrode (anode) can be removed by the plasma treatment in the atmosphere containing argon and oxygen (FIG. 5).

INDUSTRIAL APPLICABILITY

According to the present invention, a pretreatment can be performed in a short time by using a plasma treatment in an atmosphere containing argon and oxygen as a pretreatment to suppress generation of shrinkage and unevenness in light-emission without giving adverse effects to a substrate. Accordingly, throughput can be improved when display devices are mass-produced.

The invention claimed is:

1. A method for manufacturing a display device having a thin film transistor and a light emitting element, comprising the steps of:
   forming a first interlayer insulating film including a photosensitive organic material over the thin film transistor;
   selectively etching the first interlayer insulating film such that an upper edge portion of the first interlayer insulating film has a curved surface;
   forming a second interlayer insulating film covering the first interlayer insulating film and including at least one selected from the group consisting of a silicon nitride, a silicon oxynitride, and an aluminum oxynitride;
   forming a contact hole in the first interlayer insulating film and the second interlayer insulating film;
   forming a first electrode electrically connected to at least one of a source region and a drain region of the thin film transistor through the contact hole;
   forming an insulating film to cover an edge portion of the first electrode, wherein an upper edge portion of the insulating film has a curved surface;
   performing a plasma treatment on the first electrode and the insulating film in an atmosphere containing argon and oxygen;
   forming a layer containing an organic compound over the first electrode and the insulating film; and
   forming a second electrode over the layer containing the organic compound.

2. The method for manufacturing the display device according to claim 1, wherein a flow rate ratio of argon gas and oxygen gas is from 1:9 to 9:1 in the atmosphere containing argon and oxygen.

3. The method for manufacturing the display device according to claim 1, wherein the step of performing the plasma treatment in the atmosphere containing argon and oxygen, the step of forming the layer containing the organic compound, and the step of forming the second electrode are performed sequentially and continuously.

4. The method for manufacturing the display device according to claim 1, wherein the first electrode is an anode and the second electrode is a cathode.

5. The method for manufacturing the display device according to claim 1, wherein the first electrode is made of ITO.

6. The method for manufacturing the display device according to claim 1, wherein the second electrode is formed by a resistance heating method or a sputtering method.

7. The method for manufacturing the display device according to claim 1, wherein the insulating film is made of polyimide, acryl, polyamide, polyimide-amide, resist or benzocyclobutene.

8. The method for manufacturing the display device according to claim 1, wherein the curved surface of the insulating film has a curvature radius of 0.2 to 3 μm.

9. The method for manufacturing the display device according to claim 1, further comprising a step of forming an inorganic insulating film to cover the thin film transistor, wherein an upper surface of the inorganic insulating film is in contact with the first interlayer insulating film and the second interlayer insulating film.

10. A method for manufacturing a display device having a thin film transistor and a light emitting element, comprising the steps of:
    forming a first interlayer insulating film including a photosensitive organic material over the thin film transistor;
    selectively etching the first interlayer insulating film such that an upper edge portion of the first interlayer insulating film has a curved surface;
    forming a second interlayer insulating film covering the first interlayer insulating film and including at least one selected from the group consisting of a silicon nitride, a silicon oxynitride, and an aluminum oxynitride;
    forming a contact hole in the first interlayer insulating film and the second interlayer insulating film;
    forming a first electrode electrically connected to at least one of a source region and a drain region of the thin film transistor through the contact hole;
    forming an insulating film to cover an edge portion of the first electrode, wherein an upper edge portion of the insulating film has a curved surface;
    cleaning the first electrode and the insulating film;
    performing a plasma treatment on the first electrode and the insulating film in an atmosphere containing argon and oxygen;
    forming a layer containing an organic compound over the first electrode and the insulating film; and
    forming a second electrode over the layer containing the organic compound.

11. The method for manufacturing the display device according to claim 10, wherein a flow rate ratio of argon gas and oxygen gas is from 1:9 to 9:1 in the atmosphere containing argon and oxygen.

12. The method for manufacturing the display device according to claim 10, wherein the step of performing the plasma treatment in the atmosphere containing argon and oxygen, the step of forming the layer containing the organic compound, and the step of forming the second electrode are performed sequentially and continuously.

13. The method for manufacturing the display device according to claim 10, wherein the first electrode is an anode and the second electrode is a cathode.

14. The method for manufacturing the display device according to claim 10, wherein the first electrode is made of ITO.

15. The method for manufacturing the display device according to claim 10, wherein the second electrode is formed by a resistance heating method or a sputtering method.

16. The method for manufacturing the display device according to claim 10, wherein the insulating film is made of polyimide, acryl, polyamide, polyimide-amide, resist or benzocyclobutene.

17. The method for manufacturing the display device according to claim 10, wherein the curved surface of the insulating film has a curvature radius of 0.2 to 3 µm.

18. The method for manufacturing the display device according to claim 10, further comprising a step of forming an inorganic insulating film to cover the thin film transistor, wherein an upper surface of the inorganic insulating film is in contact with the first interlayer insulating film and the second interlayer insulating film.

19. A method for manufacturing a display device having a thin film transistor and a light emitting element, comprising the steps of:
    forming a first interlayer insulating film including a photosensitive organic material over the thin film transistor;
    selectively etching the first interlayer insulating film such that an upper edge portion of the first interlayer insulating film has a curved surface;
    forming a second interlayer insulating film covering the first interlayer insulating film and including at least one selected from the group consisting of a silicon nitride, a silicon oxynitride, and an aluminum oxynitride;
    forming a contact hole in the first interlayer insulating film and the second interlayer insulating film;
    forming a first electrode electrically connected to at least one of a source region and a drain region of the thin film transistor through the contact hole;
    forming an insulating film to cover an edge portion of the first electrode, wherein an upper edge portion of the insulating film has a curved surface;
    performing vacuum heating to the first electrode and the insulating film;
    performing a plasma treatment on the first electrode and the insulating film in an atmosphere containing argon and oxygen;
    forming a layer containing an organic compound over the first electrode and the insulating film; and
    forming a second electrode over the layer containing the organic compound.

20. The method for manufacturing the display device according to claim 19, wherein a flow rate ratio of argon gas and oxygen gas is from 1:9 to 9:1 in the atmosphere containing argon and oxygen.

21. The method for manufacturing the display device according to claim 19, wherein the step of performing the plasma treatment in the atmosphere containing argon and oxygen, the step of forming the layer containing the organic compound, and the step of forming the second electrode are performed sequentially and continuously.

22. The method for manufacturing the display device according to claim 19, wherein a temperature of the vacuum heating is from 100° C. to 25° C.

23. The method for manufacturing the display device according to claim 19, wherein a degree of vacuum of the vacuum heating is $1\times10^{-4}$ Pa or less.

24. The method for manufacturing the display device according to claim 19, wherein the first electrode is an anode and the second electrode is a cathode.

25. The method for manufacturing the display device according to claim 19, wherein the first electrode is made of ITO.

26. The method for manufacturing the display device according to claim 19, wherein the second electrode is formed by a resistance heating method or a sputtering method.

27. The method for manufacturing the display device according to claim 19, wherein the insulating film is made of polyimide, acryl, polyamide, polyimide-amide, resist or benzocyclobutene.

28. The method for manufacturing the display device according to claim 19, wherein the curved surface of the insulating film has a curvature radius of 0.2 to 3 µm.

29. The method for manufacturing the display device according to claim 19, further comprising a step of forming an inorganic insulating film to cover the thin film transistor, wherein an upper surface of the inorganic insulating film is in contact with the first interlayer insulating film and the second interlayer insulating film.

* * * * *